(12) United States Patent
Cheng et al.

(10) Patent No.: US 8,017,449 B2
(45) Date of Patent: Sep. 13, 2011

(54) PROCESS FOR FABRICATING ELECTRONIC COMPONENTS USING LIQUID INJECTION MOLDING

(75) Inventors: Tammy Cheng, Midland, MI (US);
Mark Dobrzelewski, Midland, MI (US);
Daniel Solomon, Midland, MI (US);
Christopher Windiate, Kawkawlin, MI (US)

(73) Assignee: Dow Corning Corporation, Midland, MI (US)

( * ) Notice: Subject to any disclaimer, the term of this patent is extended or adjusted under 35 U.S.C. 154(b) by 642 days.

(21) Appl. No.: 10/565,916

(22) PCT Filed: Jul. 29, 2004

(86) PCT No.: PCT/US2004/025050
§ 371 (c)(1),
(2), (4) Date: Jan. 25, 2006

(87) PCT Pub. No.: WO2005/017995
PCT Pub. Date: Feb. 24, 2005

(65) Prior Publication Data
US 2008/0090332 A1    Apr. 17, 2008

Related U.S. Application Data

(60) Provisional application No. 60/493,857, filed on Aug. 8, 2003.

(51) Int. Cl.
*H01L 21/56* (2006.01)
(52) U.S. Cl. ............ 438/126; 257/E21.504; 257/E23.12
(58) Field of Classification Search .................... 257/791
See application file for complete search history.

(56) References Cited

U.S. PATENT DOCUMENTS

| 3,808,673 A | * | 5/1974 | Bottini ............................ 438/25 |
| 4,293,479 A | | 10/1981 | Hanada et al. .................. 260/37 |
| 4,327,369 A | | 4/1982 | Kaplan ............................ 357/72 |
| 4,663,397 A | | 5/1987 | Morita et al. ................. 525/398 |
| 4,722,968 A | * | 2/1988 | Shimizu et al. ............... 524/862 |
| 4,778,860 A | | 10/1988 | Morita ........................... 525/431 |
| 4,802,873 A | * | 2/1989 | Barrow et al. .................... 445/6 |

(Continued)

FOREIGN PATENT DOCUMENTS

EP       0 707 042 B1    3/1998

(Continued)

OTHER PUBLICATIONS

Harper, Charles A., Ed., "Packaging Assembly Process," Packaging and Interconnection Handbook, 2nd ed., pp. 6.66-6.77, McGraw-Hill, New York, 1997.

(Continued)

*Primary Examiner* — Stephen W Smoot
(74) *Attorney, Agent, or Firm* — Erika Takeuchi

(57) ABSTRACT

A process for fabricating an electronic component includes a liquid injection molding method for overmolding a semiconductor device. The liquid injection molding method includes: i) placing the semiconductor device in an open mold, ii) closing the mold to form a mold cavity, iii) heating the mold cavity, iv) injection molding a curable liquid into the mold cavity to overmold the semiconductor device, v) opening the mold and removing the product of step iv), and optionally vi) post-curing the product of step v). The semiconductor device may have an integrated circuit attached to a substrate through a die attach adhesive.

6 Claims, 9 Drawing Sheets

U.S. PATENT DOCUMENTS

| | | | | |
|---|---|---|---|---|
| 4,880,882 | A | 11/1989 | Morita et al. | 525/446 |
| 5,387,624 | A | 2/1995 | Morita et al. | 523/220 |
| 5,492,945 | A | 2/1996 | Morita et al. | 523/212 |
| 5,691,401 | A | 11/1997 | Morita et al. | 523/435 |
| 5,933,713 | A | 8/1999 | Farnworth | 438/127 |
| 5,939,775 | A | 8/1999 | Bucci et al. | |
| 6,475,629 | B1* | 11/2002 | Takeuchi et al. | 428/450 |
| 6,654,248 | B1* | 11/2003 | Fishley et al. | 361/704 |
| 2001/0034083 | A1 | 10/2001 | Coyle et al. | |
| 2001/0040283 | A1 | 11/2001 | Konishi et al. | 257/687 |
| 2002/0153618 | A1* | 10/2002 | Hirano et al. | 257/784 |
| 2003/0145940 | A1* | 8/2003 | Chaudhury et al. | 156/272.6 |

FOREIGN PATENT DOCUMENTS

| | | |
|---|---|---|
| EP | 0 685 508 B1 | 5/1999 |
| JP | 83834/03 | 3/2003 |
| WO | WO 00/47391 A1 | 8/2000 |
| WO | WO 03/041130 A2 | 9/2002 |

OTHER PUBLICATIONS

Kroschwitz, J., ed., "Electronic Materials," Kirk-Othmer Encyclopedia of Chemical Technology, 4th ed., vol. 9, pp. 219-229, John Wiley & Sons, New York, 1994.

Abstract, DE 19801657, Jul. 29, 1999.

Abstract, "The Lead Plastic Chip Carrier—its Reliability and Use." Brodsky, et. al., Jan. 1, 1981.

Hmiel, Andrew F., et. al., "A Novel Process for Protecting Wire Bonds from Sweep During Molding,", SEMICON West 2002 Technology Symposium.

Tummala, Rymaszewski, "Microelectronics Packaging Handbook" Van Nostrand Reinhold, New York ISBN: 0442205783, p. 568-569.

* cited by examiner

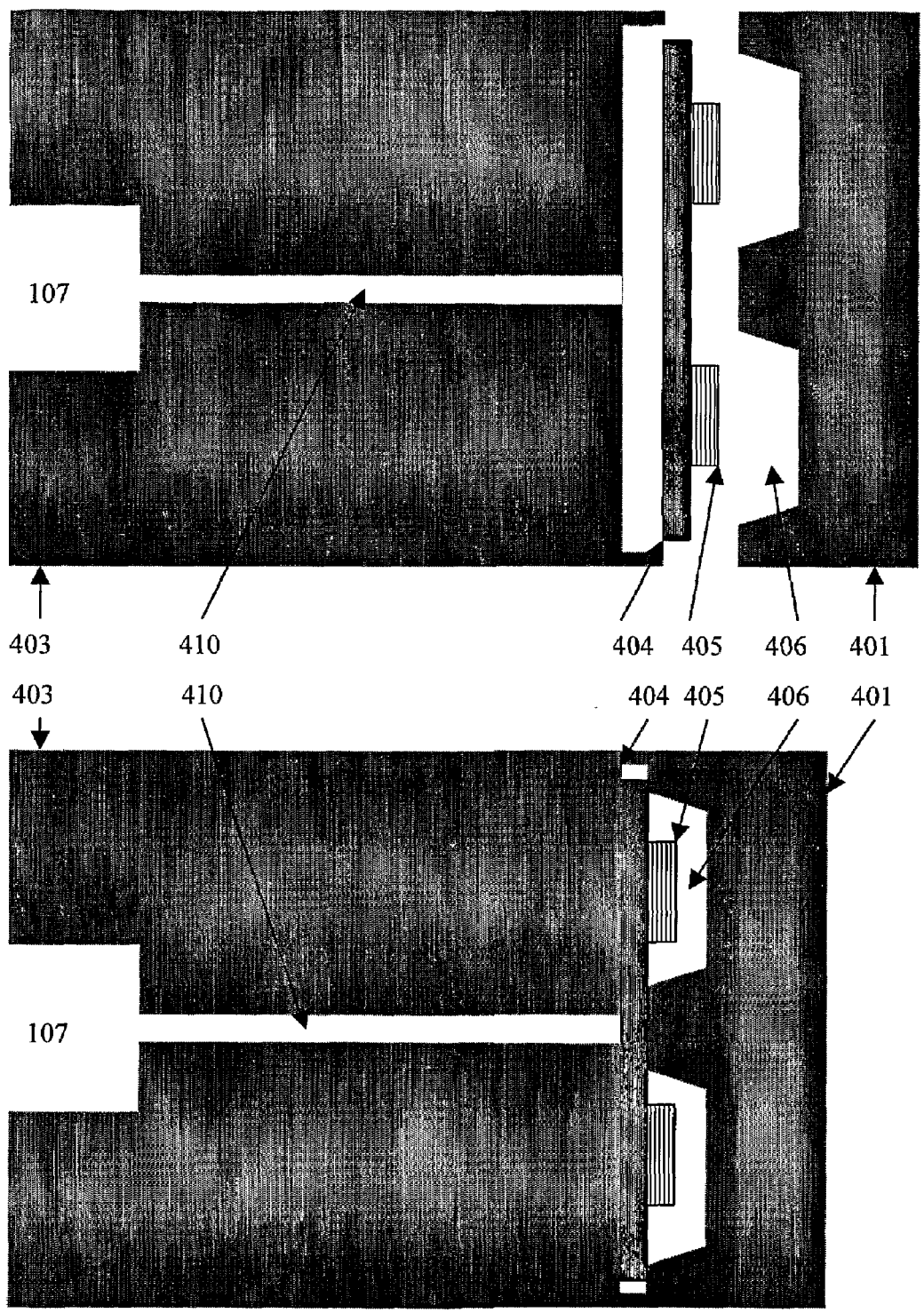

PROCESS FOR FABRICATING ELECTRONIC COMPONENTS USING LIQUID INJECTION MOLDING

CROSS REFERENCE TO RELATED APPLICATIONS

This application is a U.S. national stage filing under 35 U.S.C. §371 of PCT Application No. PCT/US2004/025050 filed on 24 Jul. 2004, currently pending, which claims the benefit of U.S. Provisional Patent Application No. 60/493,857 filed 8 Aug. 2003 under 35 U.S.C. §119(e). PCT Application No. PCT/US2004/025050 and U.S. Provisional Patent Application No. 60/493,857 are hereby incorporated by reference.

TECHNICAL FIELD

This invention relates to a process for fabricating electronic components. More particularly, this invention relates to a process for fabricating electronic components that includes a liquid injection molding method. The liquid injection molding method may be used to provide an overmold over a semiconductor die, such as an integrated circuit, on a substrate.

BACKGROUND

Several methods for overmolding an integrated circuit include stencil or screen printing, dam and fill, and transfer molding. However, overmolding methods known in the art suffer from drawbacks. For example, the stencil or screen printing method may be slow and may generate high waste, for example, as much as 70%. The dam and fill method is a two step process and may result in lower throughput. Transfer molding methods may have high waste, for example, as much as 50 to 70% of the molding material. There is a continuing need for methods of fabricating electronic components having higher efficiencies, lower temperatures, and lower waste production.

SUMMARY

This invention relates to liquid injection molding method and a process for fabricating an electronic component using the liquid injection molding method.

DETAILED DESCRIPTION OF THE INVENTION

All amounts, ratios, and percentages are by weight, unless otherwise indicated. The following is a list of definitions, as used herein.

Definitions

"M" means a monofunctional siloxane unit of the formula $RSiO_{3/2}$, where R represents a monovalent group such as an organic group, hydroxyl group, or hydrogen atom.

"D" means a difunctional siloxane unit of the formula $R_2SiO_{2/2}$.

"T" means a trifunctional siloxane unit of the formula $R_3SiO_{3/2}$.

"Q" means a tetrafunctional siloxane unit of the formula $SiO_{4/2}$.

"Silicone" and "siloxane" are used synonymously herein.

"Wire sweep" is movement of wires out of the designed shape, e.g., arc. If wire sweep is too extreme, it can result in either wire breakage or wire contact, or both. Either of these will result in a defective electronic device.

Methods of this Invention

This invention relates to a method for fabricating an electronic component. The method comprises liquid injection molding a curable liquid over a semiconductor device, where the curable liquid cures to form an overmold. The curable liquid fills the voids in the semiconductor device and forms a hermetic seal over the substrate protecting it from environmental exposure. The semiconductor device may comprise a substrate on which a semiconductor die will be mounted, a semiconductor die mounted on a substrate, where the semiconductor die has yet to be electrically connected to the substrate, or a semiconductor die mounted on a substrate, where the semiconductor die is electrically connected to the substrate. When the semiconductor device includes a semiconductor die, the semiconductor die may be attached to a substrate through a die attach adhesive by any convenient means.

For example, the semiconductor die may be attached to the substrate by a process comprising:
a) applying a die attach adhesive composition to a substrate,
b) attaching a semiconductor die to the die attach adhesive composition, and
c) curing the die attach adhesive composition to form a die attach adhesive.

Alternatively, the semiconductor die may be attached to the substrate by a process comprising:
a) applying a die attach adhesive composition to a substrate,
b) curing the die attach adhesive composition to form a die attach adhesive,
c) plasma treating a surface of the die attach adhesive,
d) plasma treating a surface of the semiconductor die, and
e) contacting the plasma treated surface of the semiconductor die with the plasma treated surface of the die attach adhesive.

These methods may optionally further comprise the step of electrically connecting the semiconductor die to the substrate after the semiconductor die is attached to the substrate through the die attach adhesive. Electrically connecting the semiconductor die to the substrate may be performed, e.g., by wire bonding, when the die attach adhesive does not provide an electrical connection between the semiconductor die and the substrate.

The semiconductor die is overmolded by injection molding a curable liquid over the semiconductor die, which may or may not be wire bonded.

Applying Die Attach Adhesive Composition

The die attach adhesive composition may be applied to the substrate by any convenient means, such as a printing process exemplified by screen printing and stencil printing. The die attach adhesive composition may comprise a curable silicone composition that cures to form a silicone, a curable silicone-organic composition that cures to form a silicone-organic copolymer, or a curable organic composition that cures to form an organic die attach adhesive.

Die Attach Adhesive

The die attach adhesive composition cures to form a die attach adhesive. The mode of cure of the die attach adhesive composition is not critical, and can include cure mechanisms such as condensation reactions; addition reactions; ultraviolet radiation initiated reactions, and free radical initiated reactions. The method of curing the die attach adhesive composition is not critical and may include, for example heating, exposure to radiation, or combinations thereof.

The die attach adhesive may be a cured organic such as a cured organic resin, a cured organic elastomer, a cured organic polymer, or combinations thereof. Suitable cured organic resins include cured epoxy resins. Suitable cured organic elastomers include polyurethane. Suitable cured organic polymers include epoxy, polyimide, polyimide copolymers, and combinations thereof. Alternatively, the die attach adhesive may be a silicone-organic copolymer such as a poly(diorganosiloxane/organic) block copolymer exemplified by poly(diorganosiloxane/amide) copolymer, and silarylene.

Alternatively, the die attach adhesive may be a cured silicone, such as a cured silicone resin, a cured silicone elastomer, a cured silicone rubber, or combinations thereof. Suitable cured silicone resins include T, DT, MT, MQ resins, and combinations thereof.

Plasma treating a surface of the die attach adhesive may be carried out by any convenient means, such as those disclosed in WO 2003/41130. "Plasma treating" means exposing a substrate to a gaseous state activated by a form of energy externally applied and includes, but is not limited to, corona discharge, dielectric barrier discharge, flame, low pressure glow discharge, and atmospheric glow discharge treatment. The gas used in plasma treatment can be air, ammonia, argon, carbon dioxide, carbon monoxide, helium, hydrogen, krypton, neon, nitrogen, nitrous oxide, oxygen, ozone, water vapor, combinations thereof, and others. Alternatively, other more reactive gases or vapors can be used, either in their normal state of gases at the process application pressure or vaporized with a suitable device from otherwise liquid states, such as hexamethyldisiloxane, cyclopolydimethylsiloxane, cyclopolyhydrogenmethylsiloxanes, cyclopolyhydrogenmethyl-co-dimethylsiloxanes, reactive silanes, and combinations thereof.

Die attach may be carried out by
a) plasma treating a surface of the die attach adhesive,
b) plasma treating a surface of the semiconductor die, and
c) thereafter contacting the plasma treated surface of the semiconductor die with the plasma treated surface of the die attach adhesive. The die attach adhesive may be contacted with the the semiconductor die as soon as practicable after plasma treatment. Alternatively, the method may optionally further comprise: storing the die attach adhesive after step a) and before step c), or storing the semiconductor die after step b) and before step c), or both.

Steps a) and b) may be carried out concurrently or sequentially in any order. Plasma treatment can be carried out on all or a portion of the surface of the die attach adhesive or the semiconductor, or both.

The die attach adhesive can be stored for at least 0, alternatively at least 1, alternatively at least 2 hours after plasma treatment. The die attach adhesive can be stored for up to 48, alternatively up to 24, alternatively up to 8, alternatively up to 4 hours after plasma treatment. The same storage conditions can be used independently for the die attach adhesive and the semiconductor.

Adhesion can be obtained by carrying out step c) for a few seconds at room temperature. Alternatively, step c) may be carried out at elevated temperature, elevated pressure, or both. The exact conditions selected for step c) will depend on various factors including the specific use of the method. However, temperature during the contacting step can be at least 15° C., alternatively at least 20° C., alternatively at least 100° C. Temperature during contacting can be up to 400° C., alternatively up to 220° C. Pressure during contacting can be up to 10 megaPascals, alternatively up to 1 megaPascal. Pressure during contacting is at least 0.1 megaPascal. Contact time can be at least 0.1 second, alternatively at least 1 second, alternatively at least 5 seconds, alternatively at least 20 seconds. Contact time can be up to 24 hours, alternatively up to 12 hours, alternatively up to 30 minutes, alternatively up to 30 seconds.

The integrated circuit may be electrically connected to the substrate by any convenient means, such as through use of an electrically conductive die attach adhesive or by wire bonding. Wire bonding methods are known in the art, for example, see Charles A. Harper, Ed., "Package Assembly Process," *Electronic Packaging and Interconnection Handbook*, 2$^{nd}$ ed., pp. pp. 6.66-6.77, McGraw-Hill, New York, 1997.

Compositions for Liquid Injection Molding

The semiconductor die is overmolded using a liquid injection molding method. The semiconductor die may be overmolded using a curable liquid organic composition, a curable liquid silicone-organic copolymer composition, or a curable liquid silicone composition. The type of curable liquid composition selected depends on various factors including the type of die attach adhesive used. Without wishing to be bound by theory it is thought that adhesion may improve when the die attach adhesive contains reactive groups with which the curable liquid used for moldmaking reacts. For example, when a silicone die attach adhesive is used, it is preferable for liquid injection molding to use a curable liquid silicone-organic copolymer composition, or a curable liquid silicone composition, having the same or similar cure mechanism such that groups reactive with the curable liquid for liquid injection molding are present in the die attach adhesive. Alternatively, when a silicone die attach adhesive is used, a curable liquid silicone composition is more preferred for liquid injection molding.

Examples of suitable curable liquid organic compositions include curable liquid epoxies, curable liquid cyanate esters, and combinations thereof. Examples of suitable curable liquid silicone-organic copolymer compositions include curable liquid compositions that cure to form poly(diorganosiloxane/organic) block copolymers such as poly(diorganosiloxane/amide) copolymers.

Suitable curable liquid silicone compositions include condensation reaction curable liquid silicone compositions; addition reaction curable liquid silicone compositions; ultraviolet radiation initiated curable liquid silicone compositions, and free radical initiated curable liquid silicone compositions.

Addition reaction curable silicone compositions may be used to minimize by-products formed when curing, as compared to the other types of curable liquid silicone compositions. The addition reaction curable liquid silicone composition may comprise (A) an organopolysiloxane having an average of at least two alkenyl groups per molecule, (B) an organohydrogenpolysiloxane having an average of at least two silicon atom-bonded hydrogen atoms per molecule, and (C) a hydrosilylation catalyst. The addition reaction curable liquid silicone composition may further comprise one or more optional ingredients selected from (D) a filler, (E) a treating agent for the filler, (F) a catalyst inhibitor, (G) a solvent, (H) an adhesion promoter, (I) a photosensitizer, (J) a pigment, (K) a flexibilizer, and combinations thereof.

Component (D) is a filler. Suitable fillers include reinforcing fillers such as silica (e.g., fumed silica, fused silica, and ground silica), titania, and combinations thereof. Alternatively, component (D) may be thermally conductive, electrically conductive, or both. Alternatively, component (D) may comprise a combination of conductive and nonconductive fillers. Component (D) may comprise DRAM grade filler or a mixture of DRAM grade filler and filler of a lesser purity than DRAM grade filler. Component (K) may comprise a long chain alpha-olefin, e.g., an olefin with 14 or more carbon atoms.

The curable liquid may be a one-part composition or a multiple-part composition such as a two-part composition. When an addition reaction curable liquid silicone composition is formulated as a one-part composition, a hydrosilylation catalyst inhibitor (F) may be included. When an addition reaction curable liquid silicone composition is formulated as a multiple-part composition, any Si—H containing ingredients are stored separately from any hydrosilylation catalyst.

The curable liquid is formulated to have a viscosity that will minimize wire sweep under the liquid injection molding conditions. Without wishing to be bound by theory, it is thought that viscosity that is too high will contribute to wire sweep, however, viscosity that is too low may allow the curable liquid to leak from the mold. For some addition reaction curable liquid silicone compositions viscosity may be 80 to 3,000 Poise.

The curable liquid may be formulated to have a cure speed that will minimize wire sweep under the liquid injection molding conditions. Without wishing to be bound by theory, it is thought that a cure speed that is too fast may contribe to wire sweep, however, cure speed that is too slow may render the process inefficient. For some addition reaction curable liquid silicone compositions, cure speed may be 30 to 120 seconds at 80 to 240° C., alternatively 30 to 60 seconds at 80 to 180° C., alternatively 30 to 60 seconds at 80 to 150° C.

The curable liquid may be formulated to cure to form an overmold having a modulus and coefficient of thermal expansion (CTE) that will enable the electronic device to pass a minimum of Moisture Resistance Testing, Level 2A, as defined by JEDEC Standard J-STD-020B. The curable liquid may be formulated to cure to form an overmold having a modulus and CTE that will further enable the electronic device to pass JEDEC Temperature Cycle Test as defined by JEDEC Standard JESD22-A, 104-B, Condition B, and to provide adequate protection for the wires in a wire bonded semiconductor die after fabrication of the semiconductor device is complete. Without wishing to be bound by theory, it is thought that if modulus is too low, the wires may not have sufficient protection after fabrication of the electronic component is complete. For some addition reaction curable liquid silicone compositions, modulus may be 25 to 1,000 megaPascals. For some organic curable liquid compositions, modulus may be up to 3,000 megaPascals. It is also thought that if CTE is too high and modulus is too low, the wires may not have sufficient protection after fabrication of the electronic component is complete. Furthermore, it is thought that if CTE and modulus are both too high, stress on the wires may be too high, resulting in reduced reliability. For some addition reaction curable liquid silicone compositions, CTE may be 80 to 300 ppm/° C., alternatively 80 to 150 ppm/° C., alternatively 80 to 100 ppm/° C. For some curable organic compositions, such as liquid epoxies, CTE may be 10 to 30 ppm/° C.

Liquid Injection Molding Method

The liquid injection molding method of this invention comprises:
i) placing a semiconductor device, described above, in an open mold,
ii) closing the mold to form a mold cavity housing the semiconductor device,
iii) heating the mold cavity,
iv) injection molding a curable liquid described above into the mold cavity to overmold the semiconductor device,
v) opening the mold and removing the product of step iv), and optionally vi) post-curing the product of step v).

Step ii) may be performed by applying a clamping force to the mold. Without wishing to be bound by theory, it is thought that if clamping force is too high, the semiconductor device may be damaged during liquid injection molding, however, if clamping force is too low, the curable liquid may leak out of the mold. For some addition reaction curable silicone compositions, step ii) may be performed by applying a clamping force of 1 to 80, alternatively 1 to 27 tonnes to the mold, alternatively 10 to 25 tonnes. Step iii) may be performed at a time and temperature of 30 to 120 seconds at 80 to 240° C., alternatively 30 to 60 seconds at 80 to 180° C., alternatively 30 to 60 seconds at 80 to 150° C.

Step iv) may be carried out at an injection speed sufficient to provide a pressure of 0.3 to 7.0 MPa in the mold cavity. Step iv) may be performed using commercially available liquid injection molding equipment, such as a liquid injection molding apparatus, Model No. 270S 250-60, from Arburg, Inc., of Newington, Conn., U.S.A with a mold available from Kipe Molds, Inc., of Placentia, Calif., U.S.A. The exact configuration of the liquid injection molding equipment depends on various factors including the exact configuration of the mold and the semiconductor device.

FIG. 1 is a schematic representation of liquid injection molding process equipment 100 for use in the method of this invention. The liquid injection molding process equipment 100 includes a feed system 101 for the two parts of a two part curable liquid silicone composition, as described above. The two parts are fed from the feed tanks 102, 103 to static mixer 104, which mixes the two parts. The resulting curable liquid silicone composition enters extruder 105 and is forced into a mold 106 through an inlet 107 to a sprue and runner system (not shown). The mold 106 may have various configurations, as discussed below and shown in FIGS. 2a-4b, which represent cross sectional views taken along cross section line and 108 and FIGS. 5-6, which represent cross sectional views taken along cross section line 109.

Alternatively, a one part curable liquid can be fed directly into extruder 105 from feed tank 102 (bypassing the static mixer 104).

FIG. 2a is a cross sectional view taken along line 108 of a mold 106 for use in the liquid injection molding process equipment 100 in FIG. 1. FIG. 2a shows the mold in its open position. The mold 106 is a three part mold in which the first section 201 houses the inlet 107 and the sprue 210. The second section 202 houses the runner system 211. The third section is a mold retainer 203 that holds the substrate 204 having semiconductor dice 205 attached to the surface of the substrate 204 in mold cavities 206. The curable liquid enters the mold cavities 206 at the tops of the semiconductor dice 205 through gates 207. FIG. 2b is the mold 106 in FIG. 2a shown in its closed position. The mold 106 in FIGS. 2a and 2b includes heaters (not shown) for the runner system 211.

FIG. 3a is a cross sectional view taken along line 108 of an alternative mold 106 for use in the liquid injection molding process equipment 100 in FIG. 1. FIG. 3a shows the mold in its open position. The mold 106 is a two part mold in which the first section 301 houses the inlet 107, sprue 310 and runner system 311. The second section is a mold retainer 303 that holds the substrate 304 having semiconductor dice 305 attached to the surface of the substrate in mold cavities 306.

The curable liquid enters the mold cavities 306 at the tops of the semiconductor dice 305 through gates 307. FIG. 3b is the mold 106 shown in FIG. 3a in its closed position. The mold 106 in FIGS. 3a and 3b has coolers, e.g., a refrigerated water system, (not shown) for the sprue 310 and runner system 311.

FIG. 4a is a cross sectional view taken along line 108 of an alternative mold 106 for use in the liquid injection molding process equipment 100 in FIG. 1. FIG. 4a shows the mold 106 in its open position. This mold 106 is a two part mold in which the first section 401 houses mold cavities 406 and the runner system (not shown). The mold retainer 403 holds the substrate 404 having semiconductor dice 405 attached to the surface of the substrate 404 in mold cavities 406. The mold retainer 403 houses the inlet 107 and the sprue 410. FIG. 4b shows the mold 106 in FIG. 4a in the closed position.

The curable liquid may be gated in different configurations using the mold 106 in FIG. 1. For example, the curable liquid may be gated at the side of the chip as shown in FIG. 5 or on top of the chip as shown in FIG. 6.

FIG. 5 is a cross sectional view taken along line 109 of a mold 106 according to FIG. 1. The mold 106 includes a sprue 410, runners 411, and gates 407. The gates 407 introduce the curable liquid into the mold cavity 406 at the side corner of each semiconductor die (not shown) within the mold cavity 406.

FIG. 6 shows a cross sectional view taken along line 109 of a mold 106 according to FIG. 1. The mold 106 includes a sprue 410, runners 411, and gates 407. The gates 407 introduce the curable liquid into the mold cavity 406 on the top of each semiconductor die (not shown) within the mold cavity 406.

The exact configuration of the mold used in step iv) depends on various factors including the type of semiconductor device and the curable liquid selected. Without wishing to be bound by theory it is thought that the molds having gates configured to introduce curable liquid into the mold cavity onto the middle of the top of each semiconductor device in the mold cavity are suitable to use when the semiconductor device is a semiconductor die wire bonded to a substrate, such as the semiconductor device shown in FIG. 7. Without wishing to be bound by theory it is thought that the molds having gates configured to introduce curable liquid into the mold cavity at the side corner of each semiconductor device in the mold cavity are suitable to use when the semiconductor device is a semiconductor die is not wire bonded to a substrate, such as the semiconductor device shown in FIG. 8.

FIG. 7 shows an electronic component 700 fabricated by the process of this invention. The electronic component 700 includes an integrated circuit 703 attached to a surface of a circuit board 705 through die attach adhesive 704. The integrated circuit 703 is electrically connected to the circuit board 705 through wires 702. Liquid injection molding is performed on the integrated circuit 703 using a curable liquid that cures to form an overmold 701. Solder balls 706 are attached to the surface of the circuit board 705 opposite the die attach adhesive 704.

FIG. 8 shows an alternative electronic component made by the process of this invention. The device 800 includes an integrated circuit 803 both attached and electrically connected to a surface of a circuit board 805 through die attach adhesive 804. The die attach adhesive 804 contains electrically conductive materials 802, which electrically connect the integrated circuit 803 to the circuit board 805. Liquid injection molding is performed on the integrated circuit 803 using a curable liquid that cures to form an overmold 801. Solder balls 806 are attached to the surface of the circuit board 805 opposite the die attach adhesive 803.

FIG. 9 shows an alternative electronic component 900 fabricated by the process of this invention. The electronic component 900 includes an integrated circuit 903 attached to a surface of a circuit board 905 through die attach adhesive 904. The integrated circuit 903 is electrically connected to the circuit board 905 through wires 902 in an alternative configuration to that shown in FIG. 7. Liquid injection molding is performed on the integrated circuit 903 using a curable liquid that cures to form an over mold 901. A separate encapsulant 910 is used to protect the wires from damage. Solder balls 906 are attached to the surface of the circuit board 905 opposite the die attach adhesive 904.

Substrate

The substrate used in the method described above is not specifically restricted. The substrate selected will depend on the various factors including the use of the method described above, e.g., the type of semiconductor device to be fabricated. The substrate can be any material used in the fabrication of an electronic device or an electronic device package, such as a circuit board (e.g., printed circuit board, PCB or PWB). The substrate can be, for example a ceramic substrate, a flexible substrate, or a rigid substrate commonly used in electronic device packaging. Examples of suitable substrates include a ceramic, a metal, a metal-coated surface, a polymer, and combinations thereof.

Metals and metal coatings include aluminum, chromium, copper, gold, lead, nickel, platinum, solder, stainless steel, tin, titanium, alloys thereof, and combinations comprising more than one metal.

Ceramics include aluminum nitride, aluminum oxide, silicon carbide, silicon oxide, silicon oxynitride, combinations thereof, and others; alternatively aluminum nitride, aluminum oxide, silicon carbide, silicon oxynitride, and combinations thereof.

Polymers include benzocyclobutene, bismaleimide, cyanate, epoxy, polybenzoxazole, polycarbonate, polyimide, polymethylmethacrylate, polyphenylene ether, polyvinylidene chloride, and combinations thereof.

Semiconductor

The semiconductor device used in the method described above is not specifically restricted. Semiconductors are known in the art and commercially available; for example, see J. Kroschwitz, ed., "Electronic Materials," *Kirk-Othmer Encyclopedia of Chemical Technology*, 4th ed., vol. 9, pp. 219-229, John Wiley & Sons, New York, 1994. Common semiconductors include silicon, silicon alloys, and gallium arsenide. The semiconductor device can have any convenient form, such as a bare die, a chip such as an integrated circuit (IC) chip, or a wafer.

EXAMPLES

These examples illustrate the invention to one skilled in the art and are not intended to limit the scope of the invention set forth in the claims.

Reference Example 1

Injection Molding Equipment

An Engel Silicone Liquid Injection Molding Machine (M/N: CC-90), which can operate between 1 and 90 tonnes clamping pressure with a 28 mm screw diameter is used for injection molding. This and comparable equipment are commercially available from ENGEL Machinery Inc., 3740 Board Road, Rd. #5, York, Pa., U.S.A.

Reference Example 2

Injection Molding Equipment

An Arburg Silicone Liquid Injection Molding Machine (M/N: ALLROUNDER 270S 250-60), which can operate between 1 and 27 tonnes clamping pressure with a 18 mm screw diameter is used for injection molding. This equipment is commercially available from ARBURG, Inc., 125 Rockwell Road, Newington, Conn. 06111, U.S.A.

Reference Example 3

Mold

A standard mold base (Catalogue: 812A-13-13-2) manufactured with Number #2 steel from D-M-E Co., 29111 Stephenson Highway, Madison Heights, Mich. 48071, USA is fabricated by Kipe Molds, Inc., 340 East Crowther Avenue, Placentia, Calif. 92870, U.S.A. to accommodate 1×6 array package. The mold is designed as a hot runner system.

Reference Example 4

1×6 BGA Strip

An electronics BGA strip with a 1×6 array strip and the following dimensions is fabricated: Length=187.5 mm, Width=40.0 mm, Height=either 0.36 mm or 0.61 mm.

Examples 1-3

Samples 1-3 are evaluated with the equipment in Reference Example 2, the mold in Reference Example 3, and the BGA strip in Reference Example 4. The samples are cured in the mold between 10-27 tonnes clamping pressure, with curing times of 30-240 sec at a temperature of 120° C. The results are in Table 1.

TABLE 1

| Sample | Processability, Injection | Adhesion |
|---|---|---|
| 1 | YES | POOR |
| 2 | YES | GOOD |
| 3 | YES | POOR |

Sample 1 is a resinous silicone matrix, which cures via hydrosilation. It forms an optically clear material upon cure. Sample 1 is a combination of 97 parts by weight of Resin/Crosslinker A and 3 parts by weight Catalyst/Inhibitor A. Resin/Crosslinker A is a combination of 81 parts vinyl-terminated silsesquioxane resin, 17 parts 1,4-bis(dimethylsilyl)benzene, 1 part of a reaction product of hydroxy-terminated dimethyl, methylvinylsiloxane, with (glycidoxypropyl)trimethoxysilane, and 1 part product(s) from the reaction of ethylene glycol and tetraethylorthosilicate. Catalyst/Inhibitor A is a combination of 3.6 parts divinyltetramethyldisiloxane and triphenylphosphine platinum complexes, 93.3 parts toluene, 3.0 parts triphenylphosphine, and 0.1 part tetramethyldivinyldisiloxane.

Sample 2 is a commercially available addition reaction curable liquid silicone composition; DOW CORNING® 6820 Microelectronic Encapsulant, which is commercially available from Dow Corning Corporation of Midland, Mich., U.S.A.

Sample 3 is a combination of 40 parts of the composition in sample 1 and 60 parts of fused silica.

Samples 1-3 show that different liquid silicone compositions are suitable for the liquid injection molding process. Sample 2 shows that adhesion can be obtained.

DRAWINGS

FIG. 1 is a schematic representation of liquid injection molding process equipment for use in the method of this invention.

FIG. 2a is a cross sectional view taken along line 108 of a mold 106 for use in the liquid injection molding process equipment 100 in FIG. 1. FIG. 2a shows the mold 106 in its open position. FIG. 2b is the mold 106 shown in its closed position.

FIG. 3a is a cross sectional view taken along line 108 of an alternative mold 106 for use in the liquid injection molding process equipment 100 in FIG. 1. FIG. 3a shows the mold in its open position. FIG. 3b is the mold 106 in its closed position.

FIG. 4a is a cross sectional view taken along line 108 of an alternative mold 106 for use in the liquid injection molding process equipment 100 in FIG. 1. FIG. 4a shows the mold in its open position. FIG. 4b shows the mold 106 in the closed position.

Figure 1:
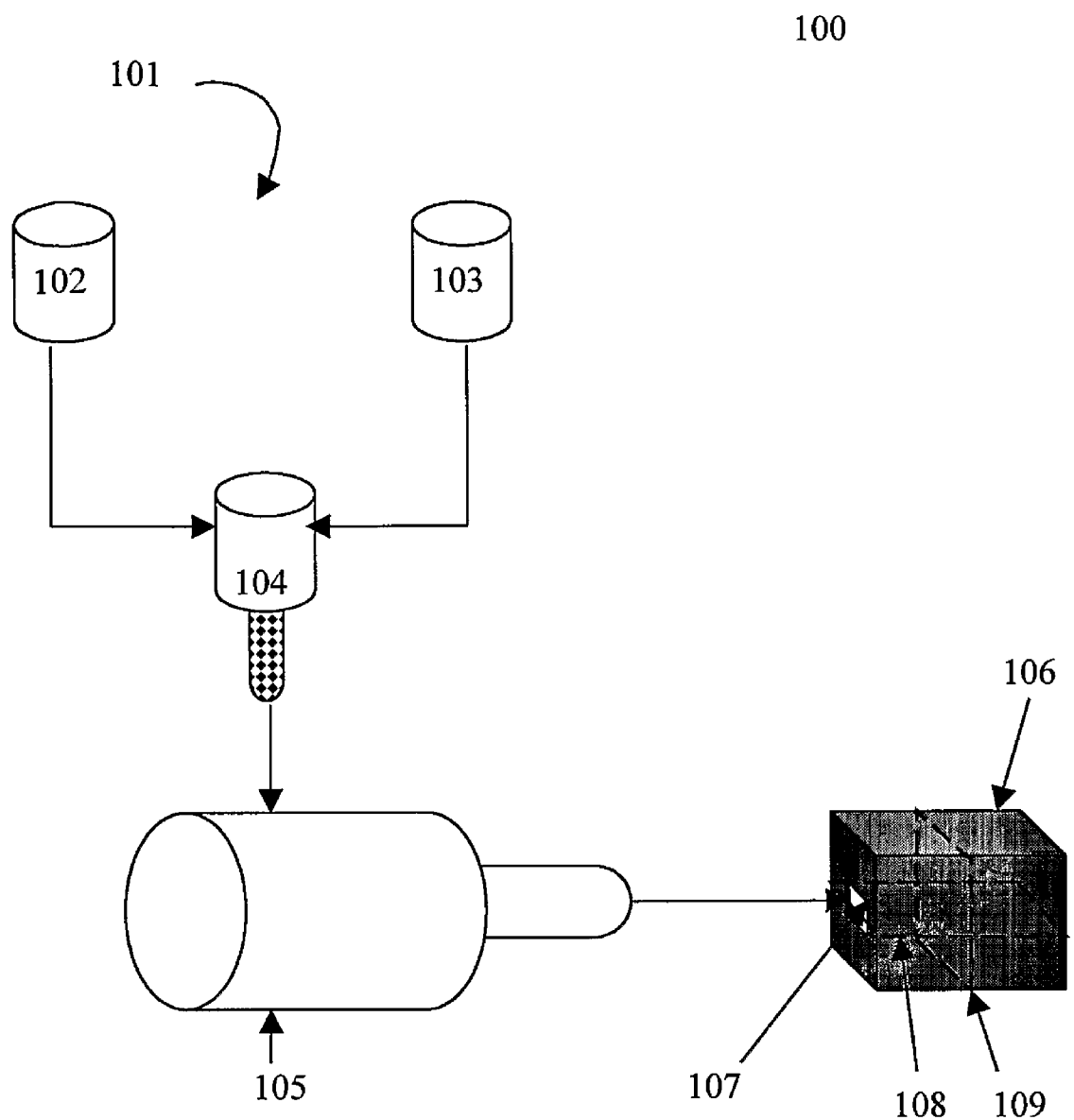
Figure 2A:
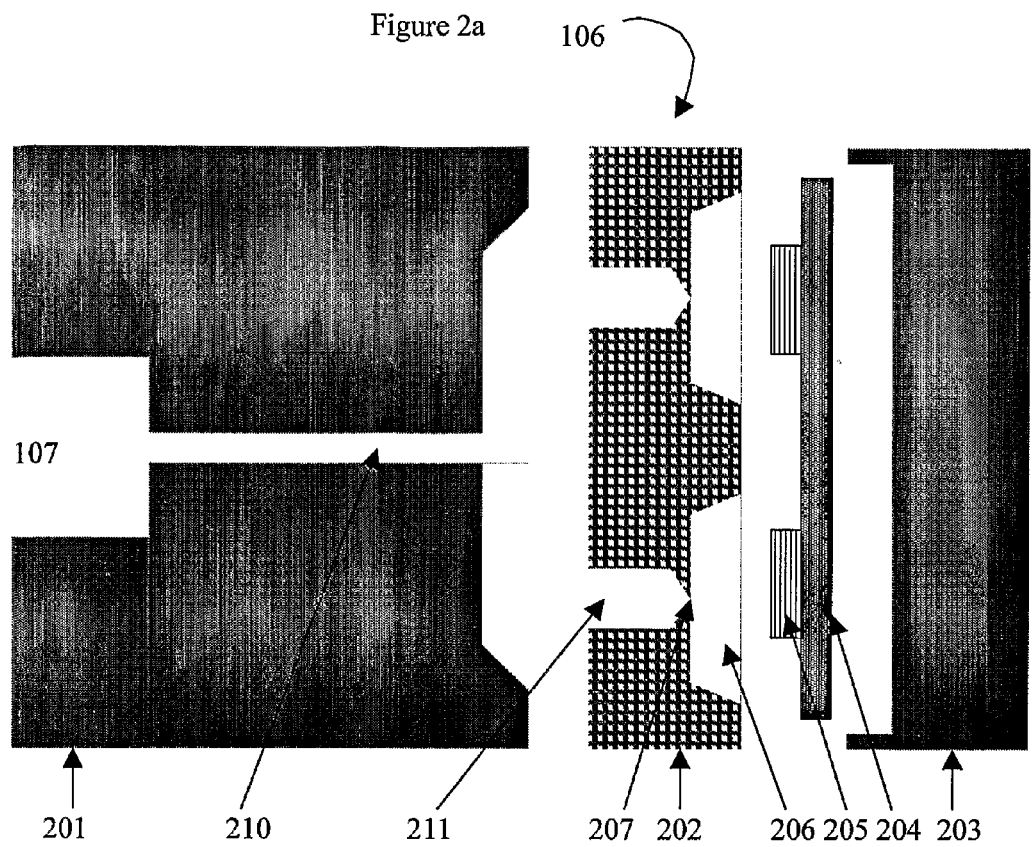
Figure 2B:
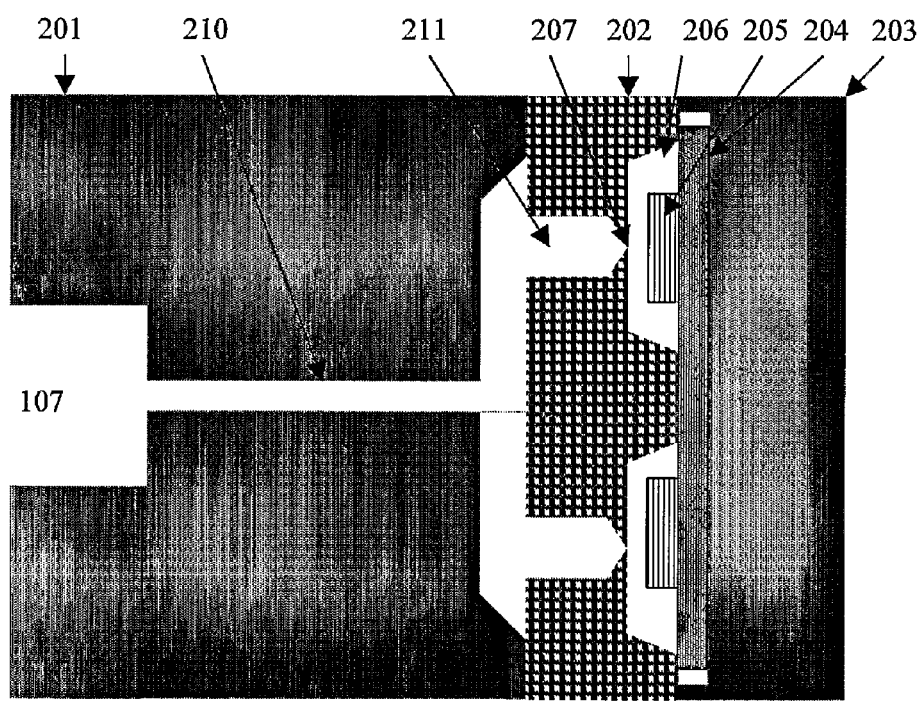
Figure 3A:
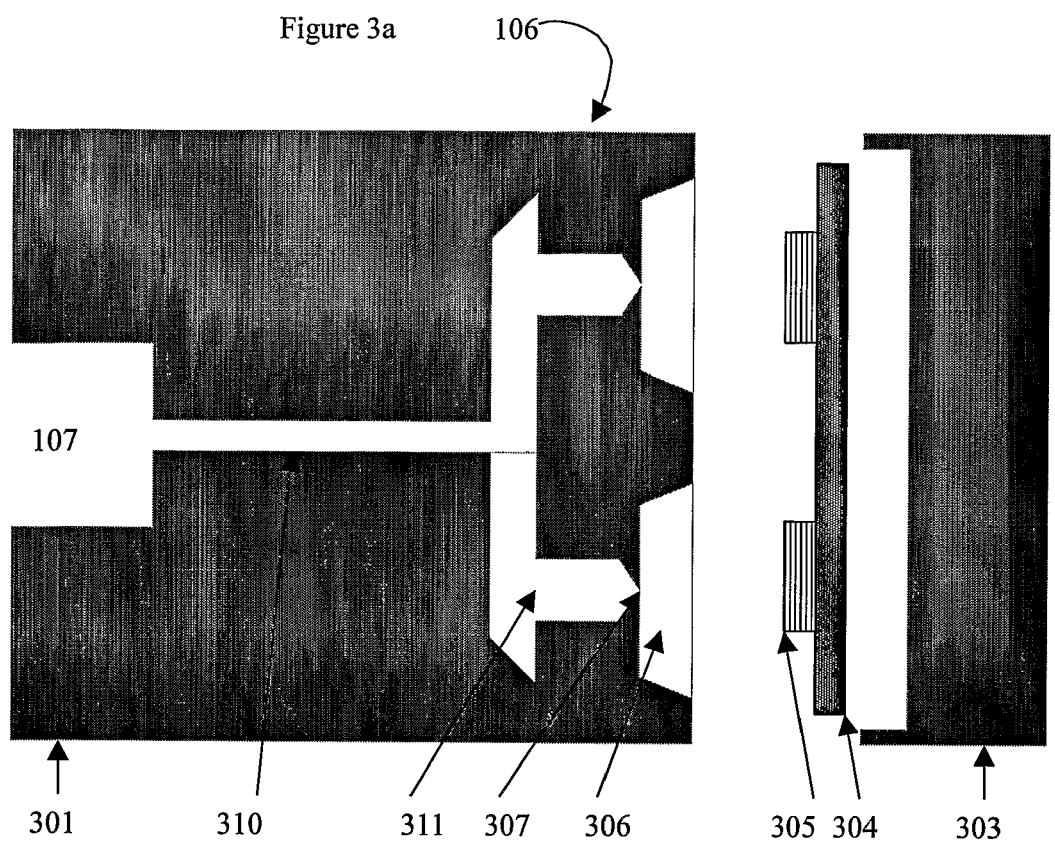
Figure 3B:
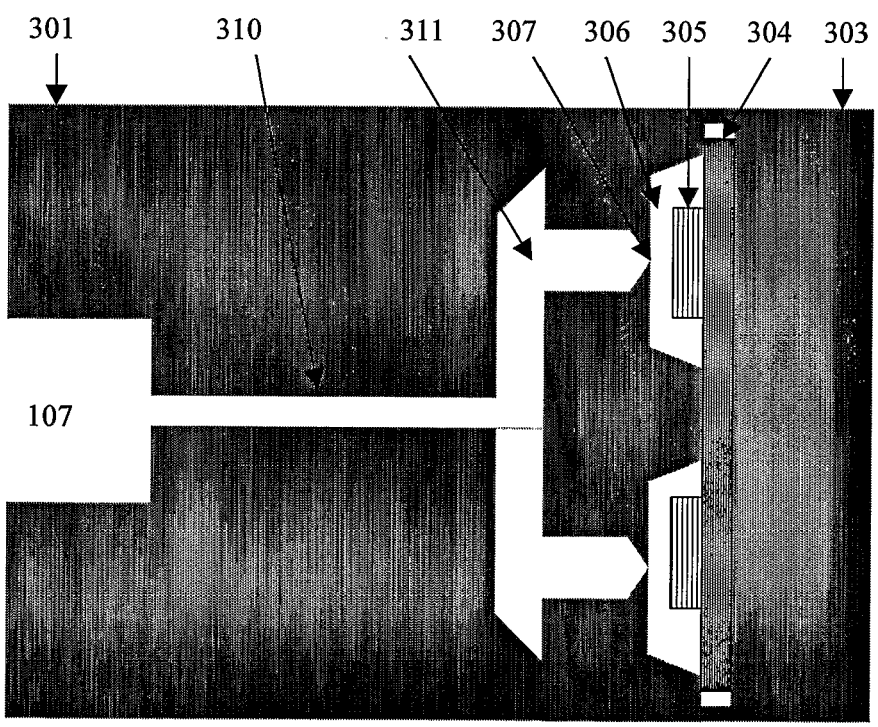
Figure 5:
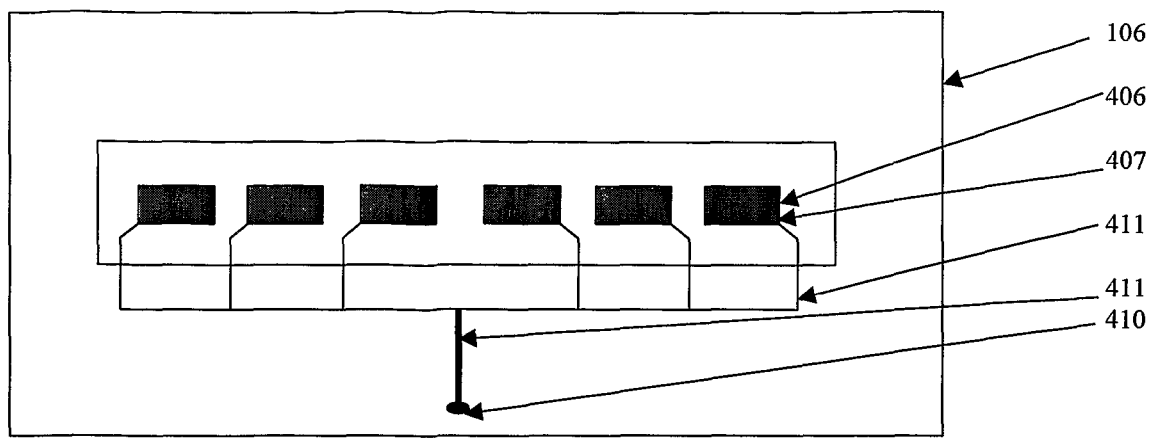
FIG. 5 is a cross sectional view taken along line 109 of a mold 106 according to FIG. 1.
Figure 6:
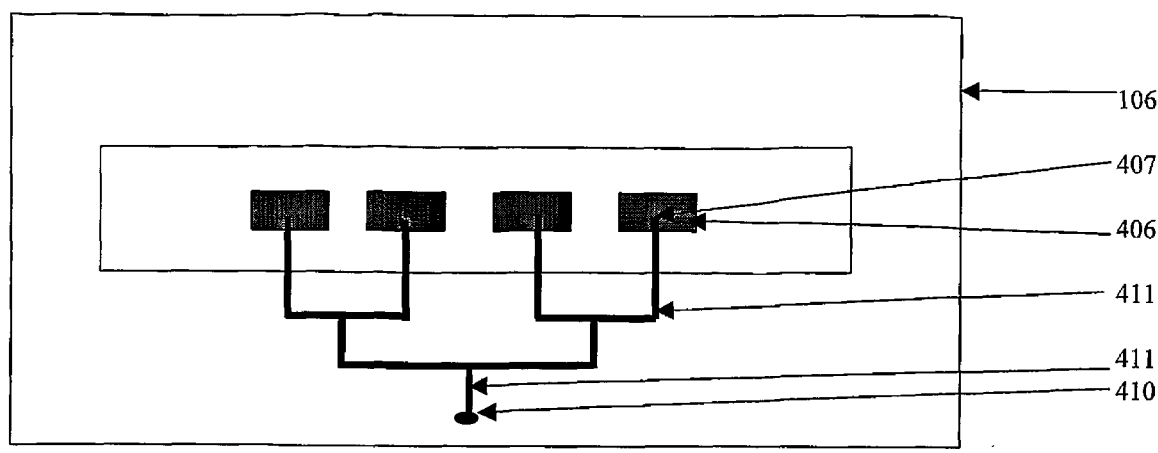
FIG. 6 shows a cross sectional view taken along line 109 of a mold 106 according to FIG. 1.
Figure 7:
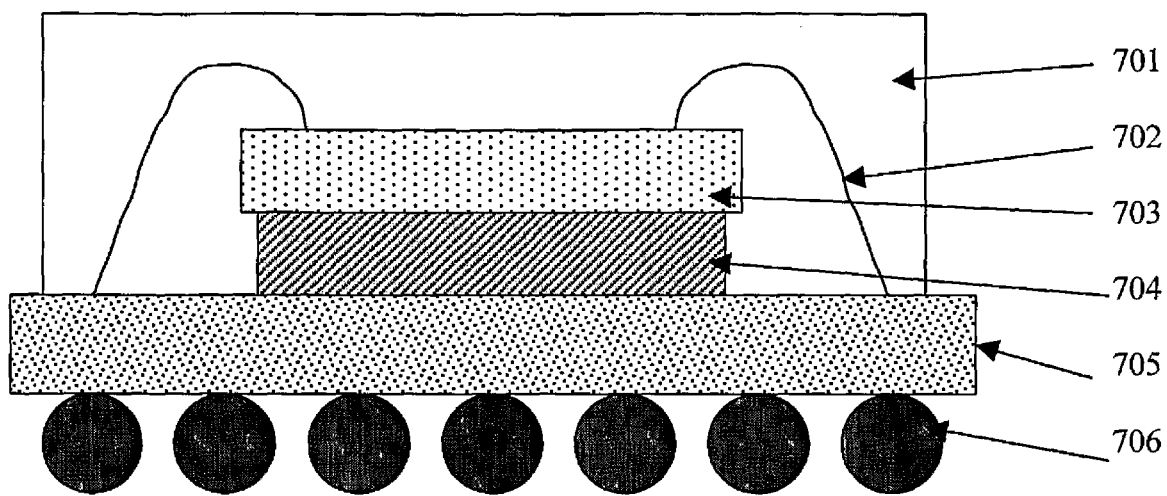
FIG. 7 shows an electronic component 700 fabricated by the process of this invention.
Figure 8:
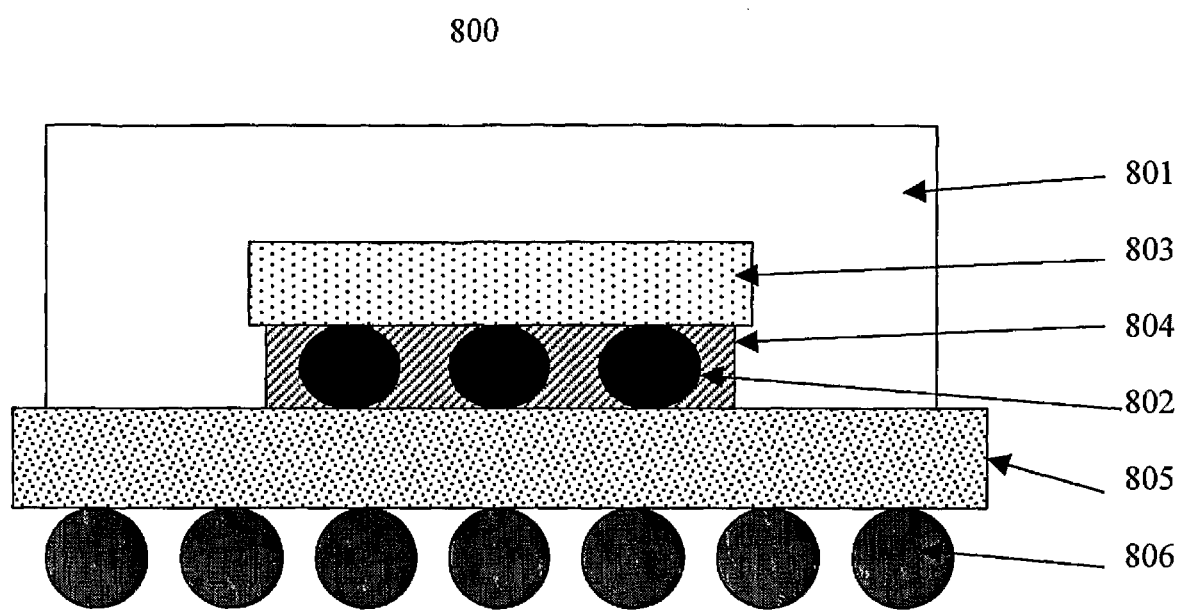
FIG. 8 shows an alternative electronic component made by the process of this invention.
Figure 9:
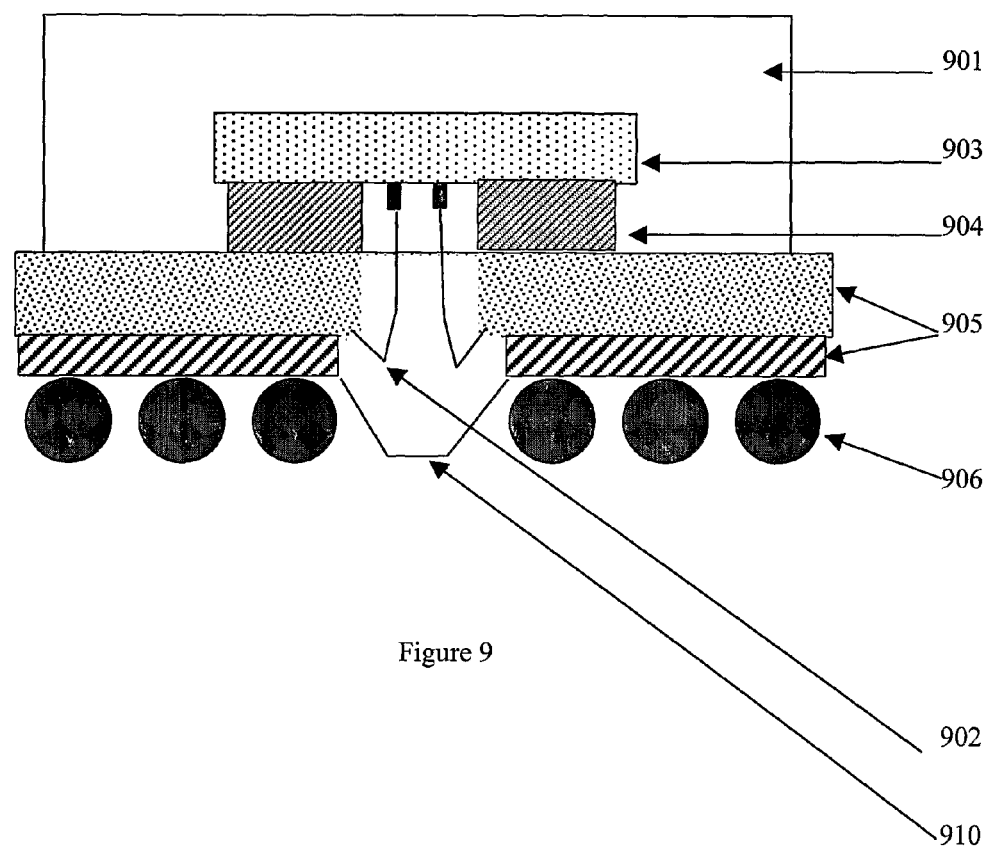
FIG. 9 shows an alternative electronic component 900 fabricated by the process of this invention.

REFERENCE NUMERALS 100 liquid injection molding process 109 cross section line
101 feed system 201 first section
102 feed tank 202 second section
103 feed tank 203 mold retainer
104 static mixer 204 substrate
105 extruder 205 semiconductor dice
106 mold 206 mold cavities
107 inlet 210 sprue
108 cross section line 211 runner system
301 first section 902 wires
303 mold retainer 903 integrated circuit
304 substrate 904 die attach adhesive
305 semiconductor dice 905 circuit board
306 mold cavities 906 solder balls
307 gates 910 encapsulant
310 sprue
311 runner system
401 first section
403 mold retainer
404 substrate
405 semiconductor dice
406 mold cavities
407 gates
410 sprue
411 runners 700 electronic component
701 overmold
702 wires
703 integrated circuit
704 die attach adhesive
705 circuit board
706 solder balls
800 electronic component
801 overmold
802 electrically conductive materials
803 integrated circuit
804 die attach adhesive
805 circuit board
806 solder balls
900 electronic component
901 overmold

The invention claimed is:

1. A method comprising:
   a) applying a silicone die attach adhesive composition to a substrate,
   b) curing the die attach adhesive composition to form a die attach adhesive,
   c) plasma treating a surface of the die attach adhesive,
   d) plasma treating a surface of a semiconductor die,
   e) contacting the plasma treated surface of the semiconductor die with the plasma treated surface of the die attach adhesive,
   f) wire bonding the semiconductor die to the substrate,
   g) injection molding a curable liquid silicone composition over the product of step f), where the silicone composition fills voids in the wire bonded semiconductor die and forms a hermetic seal over the substrate, thereby protecting it from environmental exposure, and optionally
   h) forming solder balls on a surface of the substrate opposite the die attach adhesive;
   where step g) comprises
      i) placing the product of step f) in an open mold,
      ii) closing the mold to form a mold cavity by applying a clamping force of 1 to 80 tonnes,
      iii) heating the mold cavity,
      iv) injection molding the curable liquid silicone composition into the mold cavity to overmold the semiconductor die on the substrate, wherein step iv) is carried out at an injection speed sufficient to provide a pressure in the mold cavity ranging from 0.3 to 7 megaPascals,
      v) opening the mold and removing the product of step iv), and
      optionally vi) post-curing the product of step v)
   wherein the silicone die attach adhesive composition and the curable liquid silicone composition for liquid injection molding have similar cure mechanisms such that groups reactive with the curable liquid silicone composition for liquid injection molding are present in the die attach adhesive.

2. The method of claim 1, where the silicone composition cures to form an over mold having a modulus of 25 to 1,000 megaPascals, and where the silicone composition has a viscosity of 80 to 3000 Poise and a curing profile such that the silicone composition cures in 30 to 120 seconds at a temperature of 80 to 240° C.

3. The method of claim 1, wherein the curable liquid has a cure speed of from 30 to 60 seconds at 80 to 150° C.

4. The method of claim 1, wherein the mold has a gate configured to introduce the curable liquid into the mold cavity onto a middle of a top of the product of step f) in the mold cavity.

5. A method comprising:
   a) applying a silicone die attach adhesive composition to a substrate,
   b) attaching a semiconductor die to the die attach adhesive composition,
   c) curing the die attach adhesive composition to form a die attach adhesive, optionally d) wire bonding the semiconductor die to the substrate, and
   e) injection molding a curable liquid silicone composition over the semiconductor device formed as the product of step c) or step d), wherein injection molding is carried out by a method comprising
      i) placing the semiconductor device in an open mold,
      ii) closing the mold to form a mold cavity by applying a clamping force of 1 to 80 tonnes,
      iii) heating the mold cavity,
      iv) injection molding the curable liquid silicone composition into the mold cavity to overmold the semiconductor device, wherein step iv) is carried out at an injection speed sufficient to provide a pressure in the mold cavity ranging from 0.3 to 7 megaPascals,
      v) opening the mold and removing the product of step iv), and
      optionally vi) post-curing the product of step v);
   wherein the die attach adhesive composition is a silicone die attach adhesive composition, and wherein the silicone die attach adhesive composition and the curable liquid silicone composition for liquid injection molding have similar cure mechanisms such that groups reactive with the curable liquid silicone composition for liquid injection molding are present in the die attach adhesive, with the provisos that the curable liquid silicone composition has a viscosity of 80 to 3000 Poise, and a cured product of the curable liquid silicone composition has a modulus of 100 to 1,000 megaPascals.

6. The method of claim 5, wherein the mold has a gate configured to introduce the curable liquid into the mold cavity at a side corner of the product of step c) or step d) in the mold cavity.

* * * * *